United States Patent
Riaz et al.

(10) Patent No.: US 10,415,474 B2
(45) Date of Patent: Sep. 17, 2019

(54) METHOD AND SYSTEM FOR PHASE CHANGE MATERIAL COMPONENT COOLING

(71) Applicant: GENERAL ELECTRIC COMPANY, Schenectady, NY (US)

(72) Inventors: Shahi Riaz, West Carrollton, OH (US); Paul Alexander Intemann, Fort Thomas, KY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/420,813

(22) Filed: Jan. 31, 2017

(65) Prior Publication Data
US 2018/0216894 A1 Aug. 2, 2018

(51) Int. Cl.
| | | |
|---|---|---|
| *F28D 15/00* | (2006.01) | |
| *F28D 17/00* | (2006.01) | |
| *F28D 19/00* | (2006.01) | |
| *F02C 7/12* | (2006.01) | |
| *H01L 23/427* | (2006.01) | |
| *H05K 7/20* | (2006.01) | |
| *F28D 21/00* | (2006.01) | |
| *F28D 20/00* | (2006.01) | |

(52) U.S. Cl.
CPC ............ *F02C 7/12* (2013.01); *H01L 23/4275* (2013.01); *H05K 7/20* (2013.01); *F05D 2260/20* (2013.01); *F05D 2260/208* (2013.01); *F05D 2270/00* (2013.01); *F28D 2020/0013* (2013.01); *F28D 2020/0021* (2013.01); *F28D 2021/0021* (2013.01); *F28D 2021/0026* (2013.01); *Y02T 50/672* (2013.01); *Y02T 50/675* (2013.01)

(58) Field of Classification Search
CPC ............. F28D 20/025; F28D 20/026; F28D 2020/0009; F28D 2020/0013; B62D 1/065; B60H 1/00492; B60H 1/00292
USPC .............................. 165/10, 104.14, 104.17
See application file for complete search history.

(56) References Cited

U.S. PATENT DOCUMENTS

| | | | |
|---|---|---|---|
| 6,105,659 A | * | 8/2000 | Pocol ................ B60H 1/00478 165/10 |
| 6,542,371 B1 | | 4/2003 | Webb |
| 6,639,801 B2 | | 10/2003 | Miner |
| 6,672,370 B2 | | 1/2004 | Searls et al. |
| 8,587,945 B1 | | 11/2013 | Hartmann et al. |

(Continued)

FOREIGN PATENT DOCUMENTS

| | | |
|---|---|---|
| CN | 201510307738 | 8/2015 |
| EP | 2680332 A2 | 1/2014 |

OTHER PUBLICATIONS

International Search Report and Written Opinion issued in connection with corresponding PCT Application No. PCT/US2018/012014 dated Aug. 17, 2018.

*Primary Examiner* — Jason N Thompson
(74) *Attorney, Agent, or Firm* — General Electric; James Reed (57) ABSTRACT

A transient cooling system includes a first phase change material (PCM) element and a second PCM element. The first PCM element includes a first PCM, a first surface, and a second surface, the first surface complementary to a surface to be cooled. The second PCM element includes a second PCM and a third surface in thermal contact with the second surface. The first PCM and the second PCM may have different thermal characteristics.

5 Claims, 7 Drawing Sheets

(56) References Cited

U.S. PATENT DOCUMENTS

| | | |
|---|---|---|
| 8,644,020 B2 | 2/2014 | Lau et al. |
| 9,036,352 B2 | 5/2015 | Engelhardt et al. |
| 9,392,730 B2 | 7/2016 | Hartmann et al. |
| 9,401,474 B2 | 7/2016 | Kim et al. |
| 9,476,651 B2 | 10/2016 | Thiagarajan et al. |
| 2002/0033247 A1* | 3/2002 | Neuschutz ............. F28D 20/02 165/10 |
| 2004/0244950 A1* | 12/2004 | Zhou ...................... F04B 17/00 165/104.21 |
| 2009/0180250 A1 | 7/2009 | Holling et al. |
| 2010/0038053 A1* | 2/2010 | Maxik ...................... F21K 9/00 165/80.2 |
| 2010/0321892 A1 | 12/2010 | Vander Ploeg et al. |
| 2011/0226440 A1* | 9/2011 | Bissell ................ F28D 20/0039 165/10 |
| 2011/0242764 A1 | 10/2011 | Hill et al. |
| 2011/0303946 A1* | 12/2011 | Weaver ................ F21V 29/004 257/100 |
| 2013/0174580 A1 | 7/2013 | Arafat et al. |
| 2014/0153193 A1 | 6/2014 | Engelhardt et al. |
| 2014/0183957 A1 | 7/2014 | Duchesneau |
| 2014/0216027 A1* | 8/2014 | Iida ...................... F28D 20/026 60/529 |
| 2015/0135732 A1* | 5/2015 | Pourrahimi ............. F25D 17/02 62/51.1 |
| 2016/0169591 A1 | 6/2016 | Thiagarajan et al. |
| 2016/0212841 A1 | 7/2016 | Hartmann et al. |
| 2016/0223269 A1 | 8/2016 | Hartmann et al. |
| 2016/0308126 A1 | 10/2016 | Kim et al. |

\* cited by examiner

METHOD AND SYSTEM FOR PHASE CHANGE MATERIAL COMPONENT COOLING

BACKGROUND

The field of the disclosure relates generally to component cooling and, more particularly, to a method and system for cooling of components during transient heat load events.

It is known that machinery components can be subject to high heat loads during their lifetime. Some high heat loads are relatively constant and other heat loads are transient, or are only experienced for certain periods of time. For example, components of aircraft engines are subject to high heat loads during one or more phases of a flight mission. More particularly, certain engine components experience transient heat loads during takeoff and/or climb. Transient heat loads oftentimes bring machinery components near to a temperature threshold that can be withstood by the components. In these situations, a machinery component may experience a reduced overall lifetime.

BRIEF DESCRIPTION

In one aspect, a transient cooling system including a first phase change material (PCM) element and a second PCM element is provided. The first PCM element includes a first PCM, a first surface, and a second surface, the first surface complementary to a surface to be cooled. The second PCM element includes a second PCM and a third surface in thermal contact with the second surface.

In another aspect, a method of cooling a component is provided. The method includes transferring heat from a heat generating component to a first phase change material (PCM), the first PCM having a first specific heat capacity and a first coefficient of thermal conductivity. The method also includes transferring heat from the first PCM to a second PCM, the second PCM having a second specific heat capacity and a second coefficient of thermal conductivity, the second specific heat capacity and the second coefficient of thermal conductivity different than the first specific heat capacity and the first coefficient of thermal conductivity. The method further includes storing at least a portion of the transferred heat during a first phase of operation, and releasing at least a portion of the stored heat to an ambient environment surrounding the second PCM during a second phase of operation.

In a further aspect, a method of cooling a component is provided. The method includes transferring heat from an ambient environment about the component to a first phase change material (PCM), the first PCM having a first specific heat capacity and a first coefficient of thermal conductivity. The method also includes transferring heat from the first PCM to a second PCM, the second PCM having a second specific heat capacity and a second coefficient of thermal conductivity, the second specific heat capacity and the second coefficient of thermal conductivity different than the first specific heat capacity and the first coefficient of thermal conductivity. The method further includes storing at least a portion of the transferred heat during a first phase of operation, and releasing at least a portion of the stored heat to the ambient environment surrounding the second PCM during a second phase of operation.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a," "an," and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

As used herein, the terms "axial" and "axially" refer to directions and orientations that extend substantially parallel to a centerline of the turbine engine. Moreover, the terms "radial" and "radially" refer to directions and orientations that extend substantially perpendicular to the centerline of the turbine engine. In addition, as used herein, the terms "circumferential" and "circumferentially" refer to directions and orientations that extend arcuately about the centerline of the turbine engine.

Embodiments of the phase change material (PCM) component cooling or "transient cooling" systems described herein provide a cost-effective method for providing cooling for one or more machinery components that experience transient heat loads. The transient cooling system includes a plurality of PCM elements configured to cool at least one machinery component. The PCM elements are arranged in a configuration that takes advantage of the unique properties of each individual PCM element to facilitate improved cooling during transient heat loads. As described herein, using PCMs to cool machinery components facilitates improving component lifetime while requiring little to no maintenance, providing a cost-effective and flexible transient cooling solution.

Figure 1:
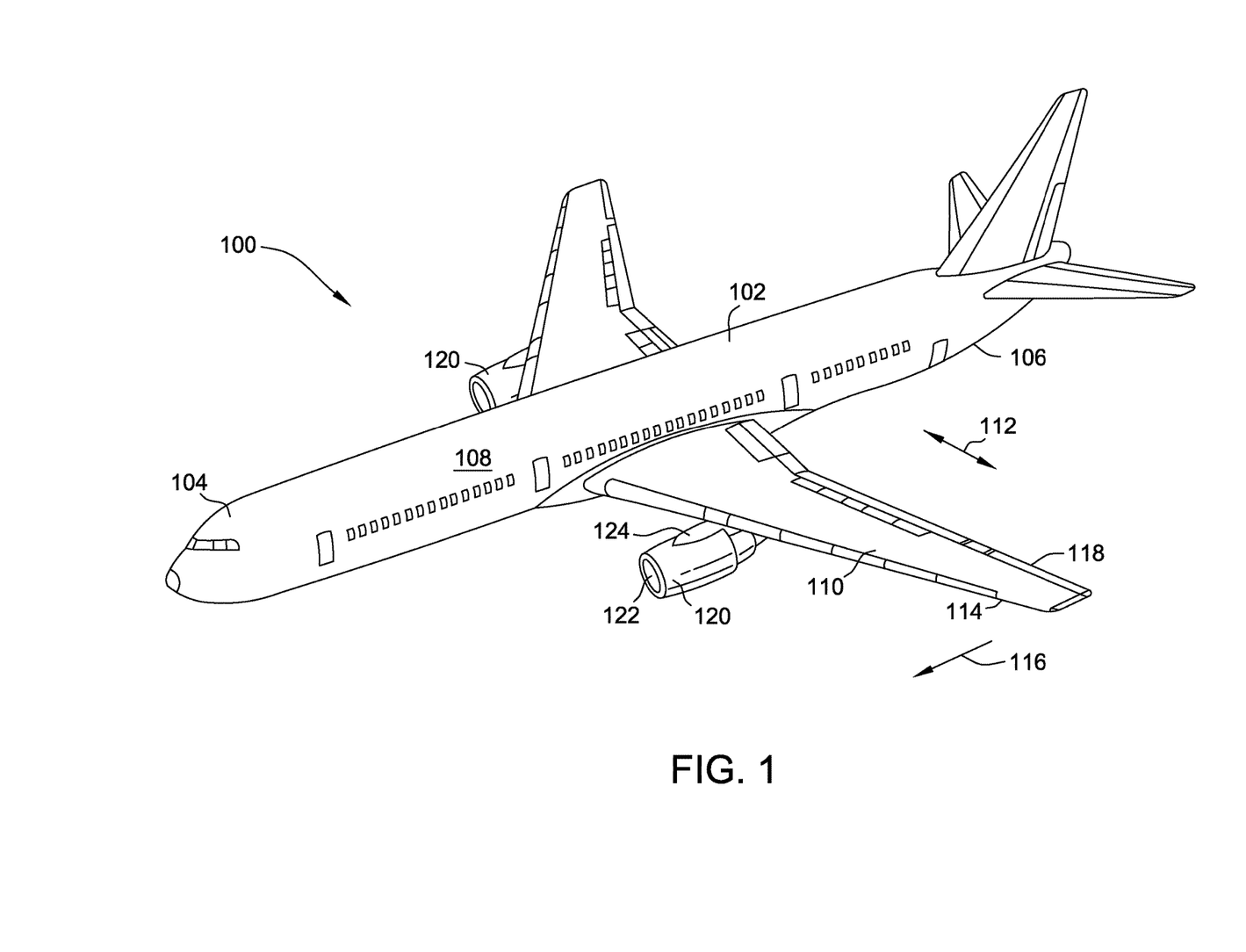
FIG. 1 is an illustration of an exemplary aircraft in accordance with an example embodiment of the present disclosure.

FIG. 1 is a perspective view of an aircraft 100. In the example embodiment, aircraft 100 includes a fuselage 102 that includes a nose 104, a tail 106, and a hollow, elongate body 108 extending therebetween. Aircraft 100 also includes a wing 110 extending away from fuselage 102 in a lateral direction 112. Wing 110 includes a forward leading edge 114 in a direction 116 of motion of aircraft 100 during normal flight and an aft trailing edge 118 on an opposing edge of wing 110. Aircraft 100 further includes at least one engine 120, such as, but not limited to a turbofan engine, configured to drive a bladed rotatable member, such as, fan 122 to generate thrust. At least one engine 120 is connected to an engine pylon 124, which may connect the turbofan engine at least one engine 120 to aircraft 100.

Figure 2:
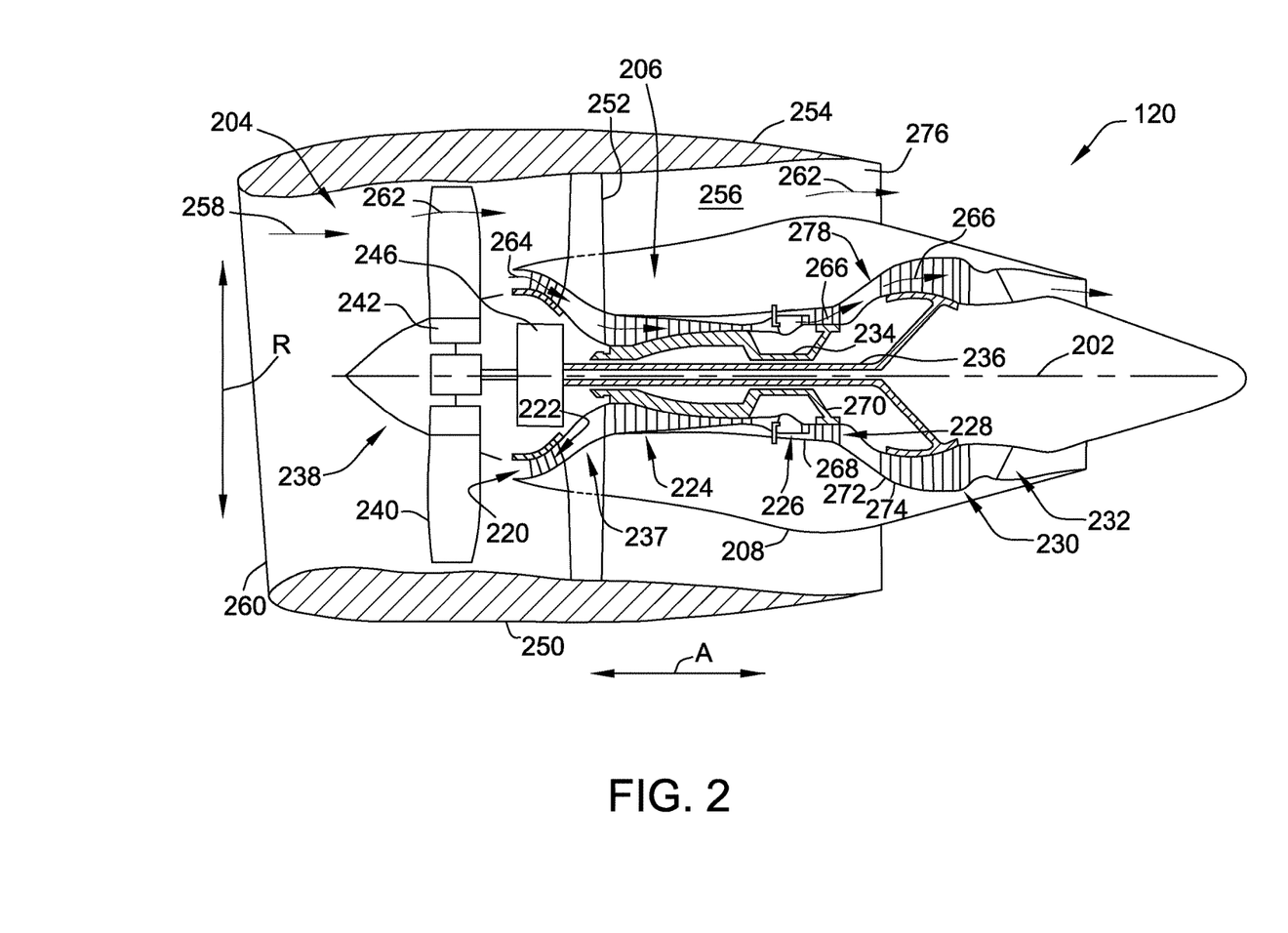
FIG. 2 is a schematic illustration of an exemplary gas turbine engine that may be used with the aircraft shown in FIG. 1.

FIG. 2 is a schematic cross-sectional view of gas turbine engine 120 in accordance with an exemplary embodiment of the present disclosure. In the example embodiment, gas turbine engine 120 is embodied in a high-bypass turbofan jet engine. As shown in FIG. 2, turbofan engine 120 defines an axial direction A (extending parallel to a longitudinal axis 202 provided for reference) and a radial direction R. In general, turbofan 120 includes a fan assembly 204 and a core turbine engine 206 disposed downstream from fan assembly 204.

In the example embodiment, core turbine engine 206 includes an engine case 208 that defines an annular inlet 220. Engine case 208 at least partially surrounds, in serial flow relationship, a compressor section including a booster or low pressure (LP) compressor 222 and a high pressure (HP) compressor 224; a combustion section 226; a turbine section including a high pressure (HP) turbine 228 and a low pressure (LP) turbine 230; and a jet exhaust nozzle section 232. A high pressure (HP) shaft or spool 234 drivingly connects HP turbine 228 to HP compressor 224.

A low pressure (LP) shaft or spool 236 drivingly connects LP turbine 230 to LP compressor 222. The compressor section, combustion section 226, turbine section, and nozzle section 232 together define a core air flowpath 237.

In the example embodiment, fan assembly 204 includes a fan 238 having a plurality of fan blades 240 coupled to a disk 242 in a spaced apart relationship. Fan blades 240 extend radially outwardly from disk 242. Fan blades 240 and disk 242 are together rotatable about longitudinal axis 202 by LP shaft 236 across a power gear box 246. Power gear box 246 includes a plurality of gears for adjusting the rotational speed of fan 238 relative to LP shaft 236 to a more efficient rotational fan speed.

Fan assembly 204 also includes an annular fan casing or outer nacelle 250 that circumferentially surrounds fan 238 and/or at least a portion of core turbine engine 206. In the example embodiment, nacelle 250 is configured to be supported relative to core turbine engine 206 by a plurality of circumferentially-spaced outlet guide vanes 252. Moreover, a downstream section 254 of nacelle 250 may extend over an outer portion of core turbine engine 206 so as to define a bypass airflow passage 256 therebetween.

During operation of turbofan engine 120, a volume of air 258 enters turbofan 120 through an associated inlet 260 of nacelle 250 and/or fan assembly 204. As volume of air 258 passes across fan blades 240, a first portion 262 of volume of air 258 is directed or routed into bypass airflow passage 256 and a second portion 264 of volume of air 258 is directed or routed into core air flowpath 237, or more specifically into LP compressor 222. A ratio between first portion 262 and second portion 264 is commonly referred to as a bypass ratio. The pressure of second portion 264 is then increased as it is routed through high pressure (HP) compressor 224 and into combustion section 226, where it is mixed with fuel and burned to provide combustion gases 266.

Combustion gases 266 are routed through HP turbine 228 where a portion of thermal and/or kinetic energy from combustion gases 266 is extracted via sequential stages of HP turbine stator vanes 268 that are coupled to engine case 208 and HP turbine rotor blades 270 that are coupled to HP shaft or spool 234, thus causing HP shaft or spool 234 to rotate, which then drives a rotation of HP compressor 224. Combustion gases 266 are then routed through LP turbine 230 where a second portion of thermal and kinetic energy is extracted from combustion gases 266 via sequential stages of LP turbine stator vanes 272 that are coupled to engine case 208 and LP turbine rotor blades 274 that are coupled to LP shaft or spool 236, which drives a rotation of LP shaft or spool 236 and LP compressor 222 and/or rotation of fan 238.

Combustion gases 266 are subsequently routed through jet exhaust nozzle section 232 of core turbine engine 206 to provide propulsive thrust. Simultaneously, the pressure of first portion 262 is substantially increased as first portion 262 is routed through bypass airflow passage 256 before it is exhausted from a fan nozzle exhaust section 276 of engine 120, also providing propulsive thrust. HP turbine 228, LP turbine 230, and jet exhaust nozzle section 232 at least partially define a hot gas path 278 for routing combustion gases 266 through core turbine engine 206.

Turbofan engine 120 is depicted in the figures by way of example only, in other exemplary embodiments, turbofan engine 120 may have any other suitable configuration including for example, a turboprop engine, a military purpose engine, and a marine or land-based aero-derivative engine.

Figure 3:
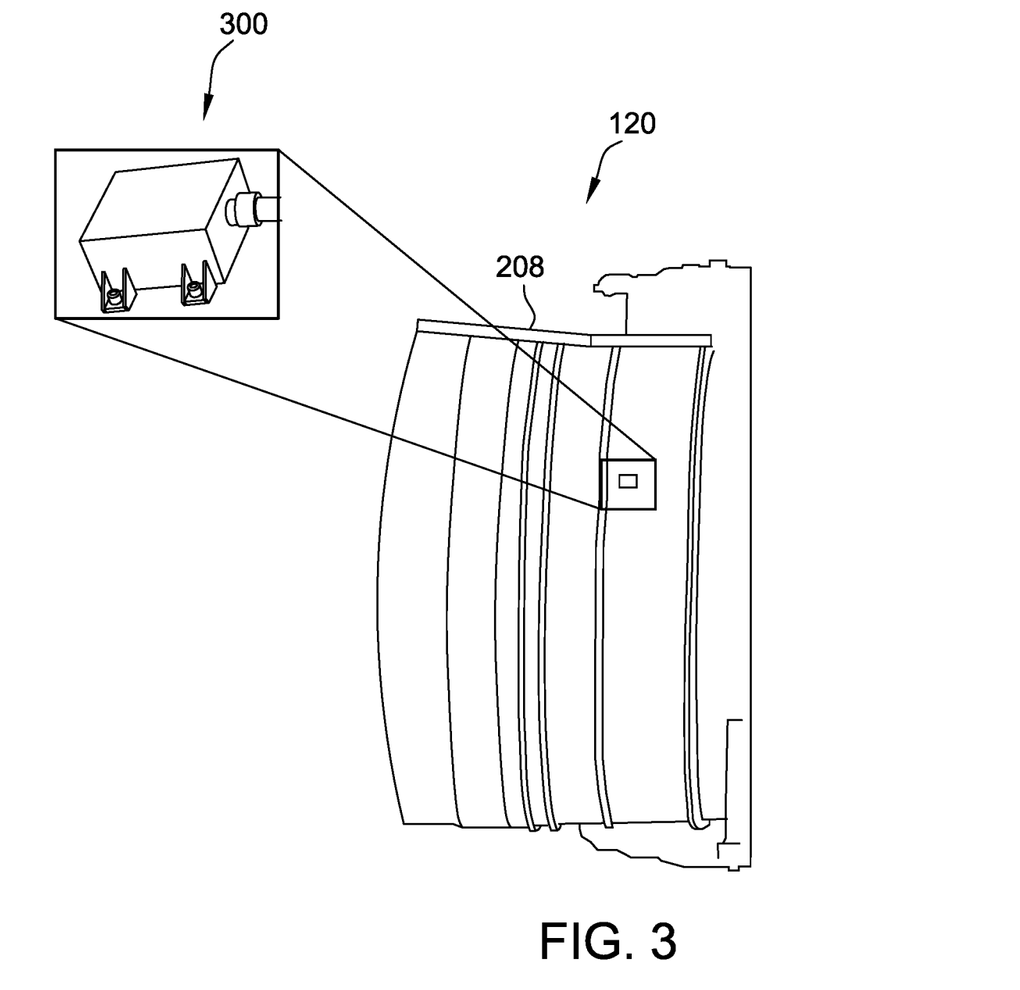
FIG. 3 is a schematic illustration of the engine shown in FIG. 2 including an electrical component.

FIG. 3 is a schematic side view of engine 120 shown in FIGS. 1 and 2, specifically of engine case 208. Engine 120 includes, in the illustrated embodiment, an electrical engine component, specifically a Debris Monitoring System (DMS) module 300 coupled thereto. DMS module 300 is configured to monitor engine health by monitoring debris in engine oil of engine 120. Engine 120 may include additional and/or alternative electrical components, such as a full authority digital engine control (FADEC). During certain flight phases such as take-off and climb, DMS module 300 is subject to a high transient heat load. In some cases, this transient heat load raises the temperature of DMS module 300 within a narrow margin (e.g., within 5-15° C.) of a maximum temperature that can be withstood by DMS module 300.

Figure 4:
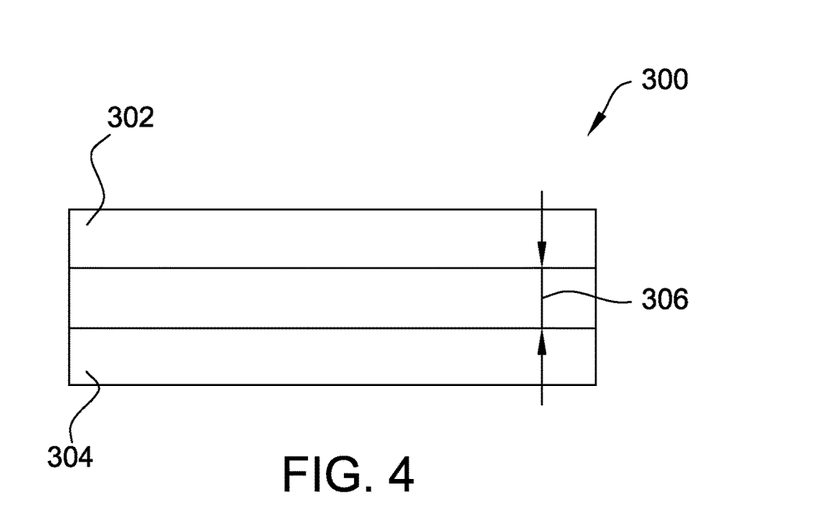
FIG. 4 is a schematic cross-sectional diagram of the electrical component shown in FIG. 3.

FIG. 4 is a simplified cross-section of DMS module 300. DMS module 300, and similar electrical engine components, include a chassis 302 that surrounds an electrical element 304 (e.g., a printed circuit board). Chassis 302 is typically made of metal, but may be fabricated from any suitable material. As illustrated in FIG. 4, an air gap 306 exists between chassis 302 and electrical element 304. It should be understood that this arrangement is not limited to engine 120, but that many types of machinery (not only aircraft) include such electrical components with similar arrangements.

When DMS module 300 is subject to high transient heat loads, electrical element 304 is vulnerable to the high temperatures, which may reduce an operational lifetime of electrical element 304. In turn, electrical element 304 may need to be repaired and/or replaced more frequently. Accordingly, providing cooling of electrical element 304 during these transient heat loads would be beneficial in extending the operational lifetime of electrical element 304.

Figure 5:
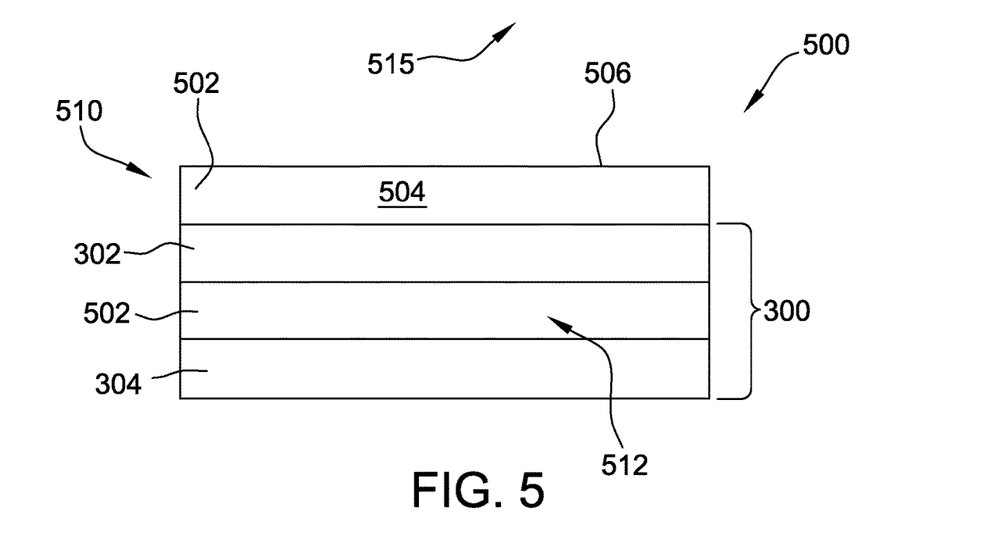
FIG. 5 is a schematic cross-sectional diagram of the electrical component shown in FIG. 3 including a transient cooling system that includes a plurality of PCM elements.
Figure 6:
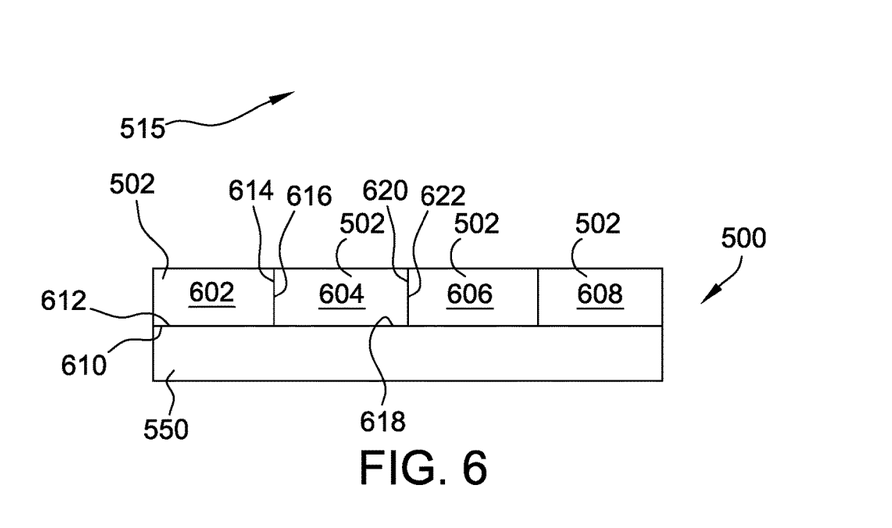
FIG. 6 is a schematic diagram of another embodiment of a transient cooling system including a plurality of PCM elements in a series arrangement.
Figure 7:
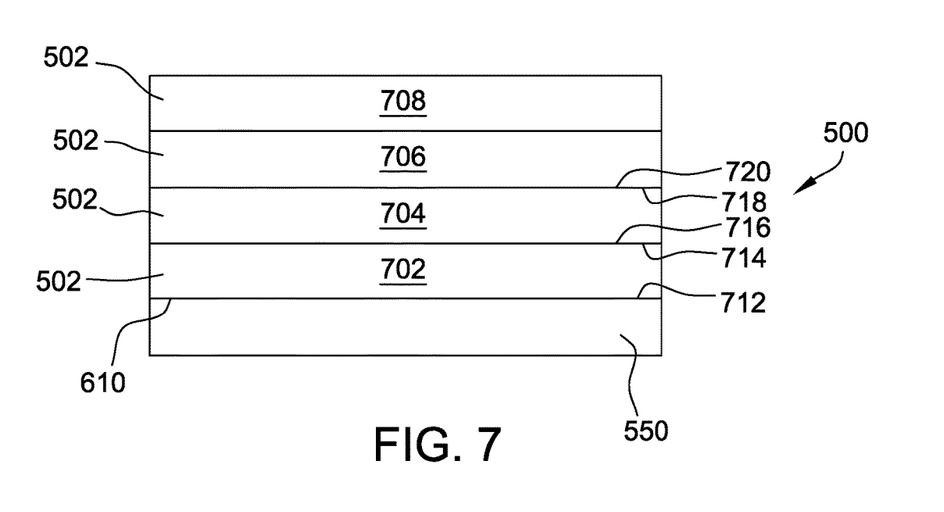
FIG. 7 is a schematic diagram of another embodiment of a transient cooling system including a plurality of PCM elements in a parallel arrangement.
Figure 8:
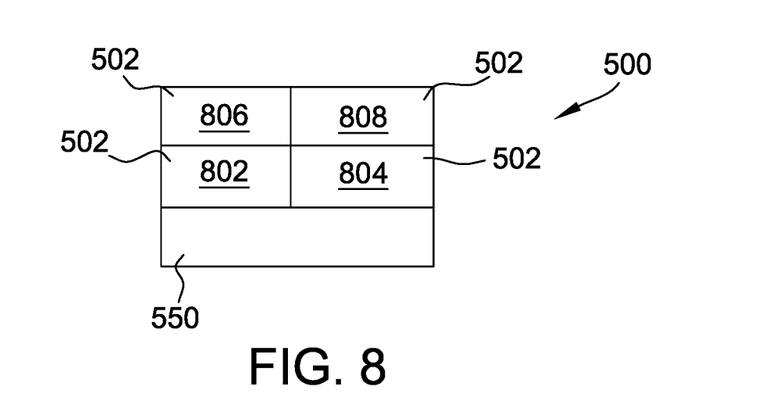
FIG. 8 is a schematic diagram of another embodiment of a transient cooling system including a plurality of PCM elements in a matrix arrangement.

In the exemplary embodiment, a PCM component cooling system, also referred to herein as a transient cooling system, including one or more PCM elements arranged within and/or about DMS module 300 is provided, to facilitate cooling of (i.e., heat transfer from) electrical element 304 during transient heat loads. FIGS. 5-8 illustrate various embodiments of a transient cooling system 500. More specifically, FIG. 5 is a schematic cross-sectional diagram of DMS module 300 (shown in FIGS. 3 and 4) and transient cooling system 500 that includes a plurality of PCM elements 502 in a first arrangement. FIG. 6 is a schematic diagram of transient cooling system 500 including a plurality of PCM elements 502 in a series arrangement. FIG. 7 is a schematic diagram of transient cooling system 500 including a plurality of PCM elements 502 in a parallel arrangement. FIG. 8 is a schematic diagram of transient cooling system 500 including a plurality of PCM elements 502 in a matrix arrangement.

In general, PCMs are materials that are known to maintain phase (e.g., a solid phase) under a high range of temperatures. Accordingly, PCMs can be used for latent heat storage, as the PCM can absorb a relatively high amount of heat while maintaining a solid phase. In addition, PCMs are reusable and "maintenance free" in that a liquid-phase PCM can transfer or release stored heat to an ambient environment and return to the solid phase for a new cycle of latent heat storage. The particular PCM(s) used in transient cooling systems 500 described further herein, provided in one or more PCM elements 502, are selected based on the particular implementation. More specifically, a PCM may be selected that has suitable characteristics such that the PCM element 502 with the selected PCM therein provides a desired heat transfer or cooling function for the location in which the PCM element 502 is located.

There are a number of factors that characterize PCMs and that drive the selection of particular PCMs for particular implementations. Perhaps most importantly, PCMs transfer, or absorb (melt) and release (freeze), heat at specific temperatures or within specific temperature ranges, known as phase change transition temperatures. For example, sugar alcohol maintains a solid phase between about 60° C. and about 200° C. Accordingly, a specific PCM is selected based upon the particular range of temperatures that are experienced by component to be cooled by the PCM. Where the temperature of the ambient environment during cooling (e.g., during transient heat loads) is known, a PCM that can provide cooling (e.g., maintain a solid phase and/or transition into a liquid phase) within a few degrees of that temperature will be selected.

Figure 9:
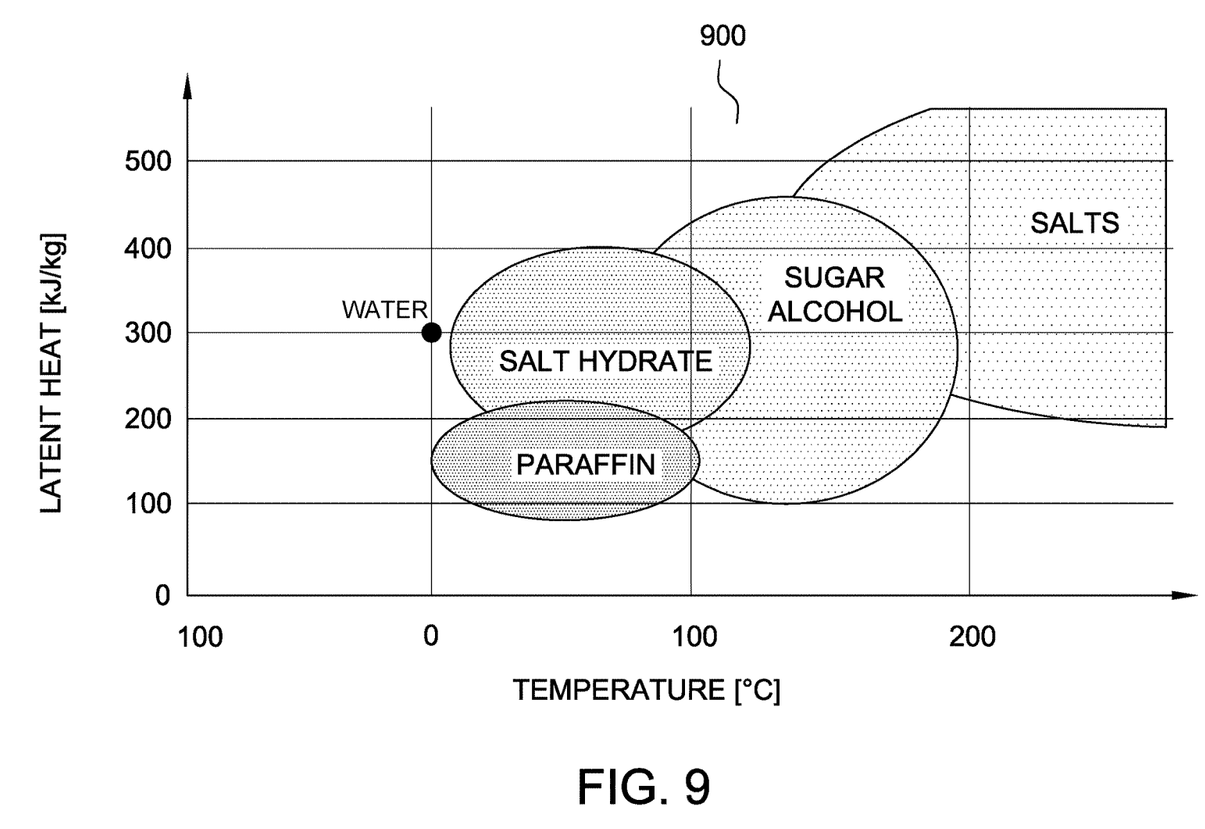
FIG. 9 is a plot illustrating characteristics of a plurality of PCMs.

In addition, a latent heat (or "latent heat of fusion") of a PCM is the change in enthalpy of the PCM resulting from absorbing heat to a specific amount of the PCM to change its state from a solid to a liquid. In other words, latent heat characterizes how much energy or heat a specific amount of PCM can hold. FIG. 9 illustrates a plot 900 of several example PCMs and their heat storage characteristics, specifically latent heat, as a function of temperature. It should be readily understood that the PCMs illustrated in plot 900 and their associated heat storage characteristics are examples and illustrate the realizable differences between PCMs that may be used to take advantage of varying thermal (e.g., heat storage) characteristics. PCMs used in implementations of the present disclosure need not be limited to the particular PCMs illustrated in plot 900 nor to the particular characteristics of the illustrated PCMs. For instance, PCMs having heat storage characteristics at temperatures not illustrated in Plot 900, and/or PCMs that are not illustrated in plot 900 but that have heat storage characteristics that fall within the ranges of plot 900, may be used within the transient cooling systems described herein without departing from the scope of the present disclosure. A latent heat absorption and release of a PCM describe a temperature range over which the PCM absorbs and releases, respectively, heat or energy. In some implementations, a PCM with a narrow temperature range of the release and absorption of latent heat is desired. In some implementations, a PCM with a broad temperature range (e.g., 10° C. or 30° C.) of release and absorption of latent heat is desired or acceptable.

A specific heat capacity of a PCM is the amount of energy needed to raise 1 kg of a material through a temperature change of 1K (or 1° C.). Accordingly, a PCM with a relatively higher specific heat capacity requires relatively less of the PCM to store a given amount of heat. In addition, a thermal conductivity (also referred to as a coefficient of thermal conductivity) of a PCM is an important factor, the thermal conductivity describing how well the PCM conducts (e.g., absorbs and/or releases) heat. In some implementations, a PCM with high thermal conductivity may be desired to quickly conduct heat from a component to be cooled. In some cases, PCMs have varying levels of each of these characteristics, including some desirable and some undesirable characteristics. For instance, a PCM may have high thermal conductivity but low specific heat capacity, whereas another PCM may have lower thermal conductivity but high specific heat capacity. Arranging PCM elements including PCMs with varying characteristics, as described herein, facilitates taking advantage of the desirable characteristics of each selected PCM (e.g., using a first PCM with high thermal conductivity to quickly conduct heat from a component to be cooled and using a second PCM with high specific heat capacity to store the heat that had been quickly conducted using the first PCM).

A stability of the PCM is also an important factor in the selection of a PCM. Over the course of hundreds or thousands of absorptions (or melts) and releases (or freezes), the phase change transition temperature and latent heat of a PCM should remain consistent. However, certain PCMs can experience chemical changes (e.g., changes in hydration sphere) over time, and these changes can affect the phase change transition temperature and/or the latent heat of a PCM. The stability of a particular PCM is determined using stability tests over multiple melt and freeze cycles.

Moreover, PCMs with certain physical characteristics are chosen for certain implementations. For example, PCMs used to cool machinery components may be non-toxic, non-flammable, and/or environmentally friendly. In addition, the interaction between the PCM and its encapsulant is another important factor. With reference to FIG. 5, encapsulation of a PCM to form a PCM element 502 as described herein involves a PCM "core" 504 (i.e., a specific amount of the PCM itself) and an outer shell or encapsulant 506. Encapsulant 506 facilitates preventing leakage, degradation, and contamination of PCM core 504, is relatively durable, and facilitates preventing excessive expansion of PCM core 504 during the phase changes thereof. PCM encapsulant 506 includes one or more of a plastic or other polymeric material, a composite sheet material (e.g., MYLAR®), metal material (e.g., copper or aluminum), composite material, and/or any other material. However, consideration must be given to the compatibility of the individual PCM core 504 with encapsulant 506 as well as to the conductivity of encapsulant 506. For instance, using plastic as an encapsulant 506 may be less expensive than using other materials, but thick plastic exhibits low thermal conductivity, reducing the efficacy of the PCM element 502. Alternatively, various metals can be used as encapsulants 506 to increase thermal conductivity. However, metals may be more costly and may corrode with some PCM cores 504.

PCM elements 502 described herein may contain, as a PCM core 504, one or more of sugar alcohol, water, a water-salt solution, sodium sulfate, lauric acid, paraffin, a fatty acid, polyethylene glycol, a salt hydrate, a nitrate, a hydroxide, a chloride, a carbonate, a fluoride, a eutectic, organic PCM, inorganic PCM, and/or any other PCM. Moreover, PCM elements 502 described herein may include a PCM core 504 including a gel composition.

Moreover, PCM elements 502 described herein are not limited in size, shape, nor configuration. Rather, the implementations provided herein are merely illustrative, and it is contemplated that PCM elements 502 may provide cooling to a plurality of other engine components, including control valves, a core casing and/or more or more core engine components (turbines, combustor, compressors), other undercowl components, and/or any other engine component experiencing high transient heat loads. In addition, PCM elements 502 may provide cooling to machinery components of other non-aircraft systems that experience high transient heat loads. PCM elements 502 may have any size, shape, and/or configuration that would be suitable for each particular implementation.

In the illustrated embodiment of FIG. 5, transient cooling system 500 includes two PCM regions, specifically, a first PCM region 510 and a second PCM region 512. First PCM region 510 is located between electrical element 304 and chassis 302 of DMS module 300 (and/or any other electrical component to be cooled), within air gap 306. Second PCM region 512 is located exterior to chassis 302, relative to electrical element 304. Second PCM region 512 encapsulates at least a portion of chassis 302. Although each PCM region 510, 512 is illustrated as including only one PCM element 502, each PCM region 510 and/or 512 may include a plurality of PCM elements 502 arranged as described further herein. Accordingly, where reference is made to a PCM element 502 in either first or second PCM region 510, 512, it should be understood that such reference may include a plurality of PCM elements 502.

PCM elements 502 in first PCM region 510 and second PCM region 512 are configured to act as a heat sink for transient heat loads to prevent electrical element 304 from experiencing temperatures above a temperature threshold specific to electrical element 304. More particularly, PCM elements 502 in second PCM region 512 are configured to act as a heat sink for transient heat loads from an ambient environment 515 around DMS module 300, such as an engine undercowl environment. PCM elements 502 in first PCM region 510 and/or in second PCM region 512 are configured to act as a heat sink for latent heat from chassis 302, to facilitate preventing chassis 302 from heating electrical element 304. PCM elements 502 in second PCM region 512 are configured to act as a heat sink of latent heat from electrical element 304. During a first phase of operation of the machinery component (i.e., while the machinery component experiences high transient heat loads, such as a takeoff or climb flight phase, in the case of aircraft components), PCM elements 502 in first and second PCM regions 510, 512 absorb heat until the PCMs therein change phase (i.e., from solid to liquid). When the ambient environment cools during a subsequent phase of operation (e.g., during a subsequent flight phase, in the case of aircraft components), PCM elements 502 release heat to the ambient environment and re-solidify. Accordingly, PCM elements 502 provide a cyclical, reusable cooling source that requires little to no maintenance and provides cooling during specific transient heat loads.

With reference now to FIG. 6, transient cooling system 500 includes a plurality of PCM elements 502 in a series arrangement adjacent to a component 550 to be cooled. "Series" arrangement, as used herein, refers to a plurality of PCM elements 502 positioned in a non-overlapping arrangement. The plurality of PCM elements 502 includes, in the illustrated embodiment, PCM elements 602, 604, 606, and 608, also referred to herein as first, second, third, and fourth PCM elements, respectively. In the example embodiment, PCM elements 502 are chemically isolated from one another (i.e., by encapsulants 506, shown in FIG. 5) and are in thermal communication with adjacent PCM element(s) 502. It should be understood that the series arrangement illustrated in one dimension in FIG. 6 may extend in at least one other direction, such that PCM elements 502 are arranged in a plane across a surface 610 of component 550 and/or about a non-planar (e.g., curved) surface 610 of component 550. Component 550 may include DMS module 300 (and/or electrical component 304 or chassis 302 thereof) or any other machinery component within ambient environment 515 experiencing high transient heat loads.

Each PCM element 502 includes a plurality of surfaces (e.g., six surfaces, wherein PCM elements 502 are substantially rectangular prismatic or cubic) through which thermal communication (i.e., absorption and release of heat) may occur. For example, first PCM element 602 includes a first surface 612 adjacent to, complementary to, and in thermal contact with surface 610 of component 550. First PCM element 602 also includes a second surface 614 adjacent to, complementary to, and in thermal contact with a first surface 616 of second PCM element 604. In addition, second PCM element 604 includes a second surface 618 adjacent to, complementary to, and in thermal contact with surface 610 of component 550, as well as a third surface 620 (opposite second PCM element first surface 616) adjacent to, complementary to, and in thermal contact with a first surface 622 of third PCM element 606.

With reference now to FIG. 7, transient cooling system 500 includes a plurality of PCM elements 502 in a parallel arrangement adjacent to component 550 to be cooled. "Parallel" arrangement, as used herein, refers to a plurality of PCM elements 502 positioned in a stacked or vertical arrangement without having PCM elements "horizontally" adjacent to one another. The plurality of PCM elements 502 includes, in the illustrated embodiment, PCM elements 702, 704, 706, and 708, also referred to herein as first, second, third, and fourth PCM elements, respectively. In the example embodiment, PCM elements 502 are chemically isolated from one another (i.e., by encapsulants 506, shown in FIG.

5) and are in thermal communication with adjacent PCM element(s) 502. It should be understood that the parallel arrangement illustrated in one dimension in FIG. 7 may extend in at least one other direction, such that PCM elements 502 are arranged about at least a portion of component surface 610 (also shown in FIG. 6). For example, PCM elements 502 may encapsulate or surround component surface 610 in the parallel arrangement.

Each PCM element 502 includes a plurality of surfaces (e.g., six surfaces, wherein PCM elements 502 are substantially rectangular prismatic or cubic). For example, first PCM element 702 includes a first surface 712 adjacent to, complementary to, and in thermal contact with surface 610 of component 550. First PCM element 702 also includes a second surface 714 adjacent to, complementary to, and in thermal contact with a first surface 716 of second PCM element 704. In addition, second PCM element 704 includes a second surface 718 (opposite first surface 716) adjacent to, complementary to, and in thermal contact with a first surface 720 of third PCM element 706.

With reference now to FIG. 8, transient cooling system 500 includes a plurality of PCM elements 502 in a matrix arrangement adjacent to component 550 (shown in FIGS. 6 and 7) to be cooled. "Matrix" arrangement, as used herein, refers to a plurality of PCM elements 502 positioned in a combination of the above-described series and parallel arrangements. In other words, PCM elements 502 are both stacked and arranged horizontally adjacent to other PCM elements 502. The plurality of PCM elements 502 includes, in the illustrated embodiment, PCM elements 802, 804, 806, and 808, also referred to herein as first, second, third, and fourth PCM elements, respectively. In the example embodiment, PCM elements 502 are chemically isolated from one another (i.e., by encapsulants 506) and are in thermal communication with adjacent PCM element(s) 502. It should be understood that the matrix arrangement illustrated in one dimension in FIG. 8 may extend in at least one other direction, such that PCM elements 502 are arranged about at least a portion of component surface 610.

Positioning PCM elements 502 in the series, parallel, and/or matrix arrangements facilitates taking advantage of the varying characteristics of the PCM in each PCM element 502. For example, a first PCM element 602, 702, 802 may have a higher thermal conductivity than a second PCM element 604, 704, 804, and second PCM element 604, 704, 804 may have a higher specific heat capacity than first PCM element 602, 702, 802. Accordingly, first PCM element 602, 702, 802 may absorb heat from component 550 and/or ambient environment 515 more quickly than second PCM element 604, 704, 804. In addition, first PCM element 602, 702, 802 may release at least a portion of the absorbed heat to second PCM element 604, 704, 804 for storage, before, during, or after first PCM element 602, 702, 802 changes phase to a liquid. Second PCM element 604, 704, 804 may absorb and hold the heat for a longer period of time before second PCM element 604, 704, 804 melts. For instance, second PCM element 604, 704, 804 may store the heat for the duration of a transient phase of operation. It should be understood that any number of PCM elements 502 with varying characteristics may be arranged in any particular arrangement that facilitates desired cooling for a particular implementation. Moreover, it should be understood that some of the PCM elements 502 in a transient cooling system 500 may include the same PCM. For instance, first PCM element 802 and fourth PCM element 808 in the matrix arrangement shown in FIG. 8 may include the same PCM.

The above-described transient cooling systems provide an efficient method for cooling of machinery components when those components undergo high transient heat loads. Specifically, the above-described transient cooling system includes a plurality of PCM elements, each including a PCM therein with characteristics chosen to provide desired cooling of the machinery component. Providing the PCM elements facilitates reducing heat loads on the component (e.g., an electrical element) during transient phases, improving margins between the transient heat load experienced by the component and the maximum temperature that can be withstood by the component. The PCM elements store latent heat in a solid phase until a maximum latent heat density is reached, at which point the PCM elements transition into a liquid phase. After the transient phase (e.g., during a cruise flight phase, in the case of aircraft components), the PCM elements dissipate the stored latent heat into an ambient environment (e.g., an undercowl environment, a fan compartment, etc.) that is much cooler relative the ambient environment during the transient phases. Accordingly, no additional cooling components or modulation controls are necessary for the PCM elements to provide sufficient cooling of the highest heat loads on the electrical engine components.

Exemplary embodiments of transient cooling systems are described above in detail. The transient cooling systems, and methods of operating such systems and component devices are not limited to the specific embodiments described herein, but rather, components of the systems and/or steps of the methods may be utilized independently and separately from other components and/or steps described herein. For example, the methods may also be used in combination with other systems requiring a cooling during one or more transient phases, and are not limited to practice with only the systems and methods as described herein. Rather, the exemplary embodiment can be implemented and utilized in connection with many other machinery applications that are currently configured to receive and accept transient cooling systems.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:
1. A transient cooling system comprising:
a plurality of phase change material (PCM) elements arranged in a stacked configuration along a surface to be cooled, each of the plurality of PCM elements comprising a PCM encapsulated by its own individual outer shell, wherein the plurality of PCM elements includes:

a first PCM element having a first PCM and a first surface complementary to, adjacent to and in thermal communication with the surface to be cooled;

a second PCM element, having a second PCM, in thermal communication with the first PCM element;

wherein the first PCM comprises a first coefficient of thermal conductivity and the second PCM comprises a second coefficient of thermal conductivity that is less than the first coefficient of thermal conductivity, the first PCM absorbing heat faster than the second PCM to cool the surface to be cooled; and wherein said first PCM comprises a first specific heat capacity and the second PCM comprises a second specific heat capacity that is higher than the first specific heat capacity, the second PCM absorbing heat from the first PCM and storing the heat.

2. The system of claim 1, wherein said first PCM is chemically isolated from said second PCM, said first PCM and said second PCM are in thermal communication.

3. The system of claim 1, wherein at least one of said first PCM and said second PCM comprise a gel composition.

4. The system of claim 1, wherein said first PCM element transfers heat from the surface to be cooled to said second PCM element.

5. The system of claim 4, wherein at least one of said first PCM element and said second PCM element releases heat to an ambient environment.

* * * * *